(12) United States Patent
    Wagener

(10) Patent No.: US 11,596,089 B2
(45) Date of Patent: Feb. 28, 2023

(54) METHOD FOR SHIELDING COMPONENTS

(71) Applicant: Bayerische Motoren Werke Aktiengesellschaft, Munich (DE)

(72) Inventor: Wolfram Wagener, Geisenhausen (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 0 days.

(21) Appl. No.: 17/049,868

(22) PCT Filed: May 8, 2019

(86) PCT No.: PCT/EP2019/061803
§ 371 (c)(1),
(2) Date: Oct. 22, 2020

(87) PCT Pub. No.: WO2019/233694
PCT Pub. Date: Dec. 12, 2019

(65) Prior Publication Data
US 2021/0243924 A1    Aug. 5, 2021

(30) Foreign Application Priority Data

Jun. 6, 2018    (DE) ..................... 10 2018 208 925.6

(51) Int. Cl.
*B05D 1/02* (2006.01)
*H05K 9/00* (2006.01)
*C23C 4/131* (2016.01)

(52) U.S. Cl.
CPC .............. *H05K 9/0049* (2013.01); *B05D 1/02* (2013.01); *C23C 4/131* (2016.01); *H05K 9/0081* (2013.01)

(58) Field of Classification Search
CPC ......... H05K 9/0049; B05D 1/02; C23C 4/131
See application file for complete search history.

(56) References Cited

U.S. PATENT DOCUMENTS

| | | | |
|---|---|---|---|
| 6,013,203 A * | 1/2000 | Paneccasio, Jr. .... | H05K 9/0092 252/514 |
| 7,615,281 B2 | 11/2009 | Yamamoto et al. | |
| 2002/0174994 A1 | 11/2002 | Wu | |
| 2004/0071970 A1 | 4/2004 | Kahl et al. | |
| 2007/0003757 A1 | 1/2007 | Yamamoto et al. | |
| 2009/0092762 A1 | 4/2009 | Soong | |

(Continued)

FOREIGN PATENT DOCUMENTS

| | | |
|---|---|---|
| CN | 1444439 A | 9/2003 |
| CN | 1907514 A | 2/2007 |

(Continued)

OTHER PUBLICATIONS

PCT/EP2019/061803, International Search Report dated Aug. 16, 2019 (Two (2) pages).

(Continued)

*Primary Examiner* — Nathan T Leong
(74) *Attorney, Agent, or Firm* — Crowell & Moring LLP

(57) ABSTRACT

A method for shielding components includes the steps of providing a component and applying at least one coating region, designed to shield from a magnetic and/or an electrical field, to the component by a thermal and/or kinetic spraying method such that a first arrangement space is shielded from a second arrangement space.

5 Claims, 1 Drawing Sheet

(56) References Cited

U.S. PATENT DOCUMENTS

| | | | | |
|---|---|---|---|---|
| 2010/0046170 | A1* | 2/2010 | Stevenson | C08K 7/24 |
| | | | | 361/708 |
| 2015/0245543 | A1 | 8/2015 | Jang et al. | |
| 2015/0375596 | A1* | 12/2015 | Blain | B60K 1/04 |
| | | | | 165/47 |
| 2017/0094779 | A1 | 3/2017 | Go et al. | |
| 2018/0077787 | A1* | 3/2018 | Zierhut | C23C 4/134 |

FOREIGN PATENT DOCUMENTS

| | | |
|---|---|---|
| CN | 2917207 Y | 6/2007 |
| CN | 101478118 A | 7/2009 |
| CN | 101976096 A | 2/2011 |
| CN | 102577138 A | 7/2012 |
| CN | 104396359 A | 3/2015 |
| CN | 104823338 A | 8/2015 |
| CN | 106064837 A | 11/2016 |
| CN | 106537686 A | 3/2017 |
| CN | 108076618 A | 5/2018 |
| DE | 10 2004 047 357 A1 | 4/2006 |
| JP | 2005-68201 A | 3/2005 |
| JP | 2018-61035 A | 4/2018 |
| WO | WO 00/29635 A2 | 5/2000 |
| WO | WO 2004/043123 A1 | 5/2004 |
| WO | WO 2005/052080 A1 | 6/2005 |

OTHER PUBLICATIONS

German Search Report issued in German application No. 10 2018 208 925.6 dated Mar. 15, 2019, with Statement of Relevancy (Eleven (11) pages).

English-language Chinese Office Action issued in Chinese application No. 201980027207.9 dated Oct. 17, 2022 (Nine (9) pages).

* cited by examiner

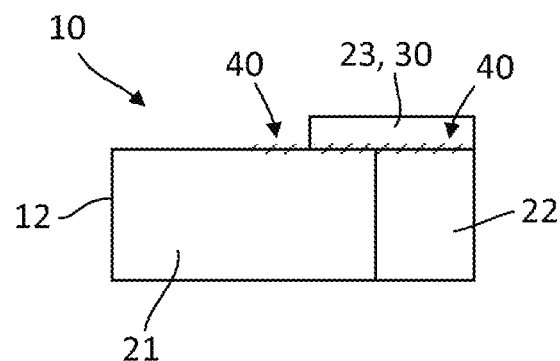

METHOD FOR SHIELDING COMPONENTS

BACKGROUND AND SUMMARY OF THE INVENTION

The present invention relates to a method for shielding components, a housing and a vehicle component.

The components in question are in particular vehicle components, such as chassis components or housings of or for vehicle components, such as in particular electrical and/or mechanical drive components and also any additional components or else chassis components. These include for example electric motors, high-voltage accumulators, the power electronics system, transmission, etc. In the development of housings, for example, it is increasingly being attempted to integrate an increasing number of components. The background to this is the possibility of thereby saving installation space, making assembly easier, reducing weight or lowering costs. However, the electrification of the drivetrain is not infrequently accompanied by problems, since the electrical or magnetic fields generated during the operation of the components may interfere with any adjacent components there may be, and vice versa. In order to counter this problem, shielding plates or the like are often used. However, these take up installation space, represent additional costs, in particular in assembly, increase the weight and moreover require further working steps in assembly, etc., whereby the number of possible sources of error also increases.

It is therefore an object of the present invention to provide a method for shielding components, a housing and also a vehicle component that eliminate the aforementioned disadvantages and at the same time can be produced at low cost, or can be realized at low cost, in particular also in mass production.

According to the invention, a method for shielding components comprises the steps of:

providing a component;

applying to the component at least one coating region, which is designed for shielding from magnetic and/or electrical fields, by means of a thermal and/or kinetic spraying method.

An electrical and/or magnetic shielding is advantageously not realized by way of arranging shielding plates or the like, but in a positionally accurate and targeted manner by way of one or more coating regions that are applied directly straight onto the component. Maximum flexibility is obtained in particular by a thermal and/or kinetic spraying method being used for the application, whereby even the most complicated geometries are suitable for application of the coating regions. What is more, even places that are difficult to access can be reached.

According to a preferred embodiment, the spraying method is in particular a thermal or kinetic spraying or coating method, such as particularly preferably arc wire spraying, or else cold gas spraying. Both methods have proven to be very robust and advantageously make extremely short cycle times possible.

According to one embodiment, the at least one coating region has a thickness in a range of approximately 50-800 µm, particularly preferably in a range of approximately 200-600 µm, most particularly preferably in a range of approximately 250 µm. The direct coating of the respective component offers the advantage that a thickness of the coating can be designed individually and in dependence on the interfering signals, the electromagnetic fields, etc., occurring.

According to one embodiment, the method comprises the step of:

accelerating a coating material to a speed greater than 100 m/s.

It has been found that best results can be achieved with these values. Depending on the method used, the speeds may also be significantly higher. Thus, for example, in the case of high velocity oxygen fuel spraying speeds in a range of 1000 m/s and more are reached, similarly in the case of cold gas spraying.

According to one embodiment, the method comprises the step of:

applying a number of coating regions of different thicknesses and/or sizes.

As a result, components can be advantageously shielded individually and in a time-saving manner.

According to one embodiment, the method comprises the steps of:

simulating/calculating the electrical and/or magnetic field;

positionally accurately applying the at least one coating region, in particular in dependence on the results of the simulation and/or calculation.

Therefore, coating is advantageously only carried out where it is necessary according to the simulation/calculation. The method makes it possible to dispense with the arrangement of shielding plates, etc. Consequently, both costs in production and in assembly can be reduced. Moreover, installation space is not wasted unnecessarily.

According to the invention, a housing comprises a housing wall, the housing according to one embodiment being formed in particular from a light metal, such as aluminum and/or magnesium, which shapes or forms a multiplicity of arrangement spaces, the arrangement spaces being designed for arranging a multiplicity of components, from which electrical and/or magnetic fields are emitted or may be emitted, at least during operation, and the housing wall having at least one coating region, which is intended for shielding the fields, and the at least one coating region being positionally accurately arranged and dimensioned in such a way that at least one of the arrangement spaces is shielded with respect to the fields or these fields are at least significantly diverted, whereby at least one protective space is formed, and the at least one coating region being produced by the method according to the invention. According to one embodiment, the housing forms three arrangement spaces, a first arrangement space being intended for an electric motor, a second arrangement space being intended for a transmission arranged downstream of the electric motor and a third arrangement space being intended for the associated power electronics system. The electric motor may be for example a current-excited synchronous motor or a permanently excited motor. In any event, the electromagnetic fields occurring during operation, for example during highly variant load cases, may possibly interfere with the power electronics system. The housing wall is thus advantageously provided or coated with coating regions in such a way that, for example, the space in which the power electronics system is located is shielded in a targeted manner from any interference signals, electromagnetic fields, etc., there may be, in other words this space is therefore formed as the protective space.

According to one embodiment, the at least one coating region is arranged or formed on the inside of the housing wall. The "inside" means the region of the arrangement space that is directed toward the component arranged therein.

According to one embodiment, the at least one coating region is arranged or formed on the outside of the housing wall. Correspondingly, it is also possible to provide coating regions both on the inside and on the outside of the housing wall and possibly also arrange them as it were "one behind the other". To this extent, very effective and efficient shieldings can be realized without additional installation space, with at the same time very thin coating regions.

It should be mentioned at this point that a ceramic, such as Al2O3, or magnesium is preferably used as the coating material. These materials can also be used particularly well with the aforementioned coating methods.

As already mentioned, preferably arranged in the protective space is a power electronics system, which is protected in an ideal way from interfering influences from the surroundings.

According to a preferred embodiment, the housing wall is produced from an aluminum material or an aluminum alloy, since with this material low component weights can be realized.

According to a preferred embodiment, the housing is cast, in particular produced by metal casting. Possible casting methods are in this case, for example, gravity casting, low-pressure casting or die casting.

According to a preferred embodiment, the housing is formed in particular as one part or integrally. In other words, the arrangement spaces are formed by the housing wall. Alternatively, the housing may however also be put together or assembled from individual parts.

The invention is also directed to a vehicle component, in particular a chassis component, which is produced or coated by the method according to the invention. The vehicle component is preferably made of light metal, such as aluminum and/or magnesium. According to one embodiment, it is also a cast part or a formed part, for example a part formed by means of hydroforming. The method is particularly suitable for a chassis component, since in the course of the electrification of motor vehicles inductive charging methods are increasingly being used. This involves the vehicle being positioned over a corresponding coil, which is for example arranged in the ground. The coating region or regions allow vehicle components to be shielded specifically and at low cost, possibly even in the fitted state, whereby unwanted interaction can be avoided during inductive charging, for example an electrical charging operation that may be performed.

The advantages and features mentioned in connection with the vehicle component and the housing also apply analogously and correspondingly to the method, and vice versa and with respect to one another.

Further advantages and features emerge from the following description of a schematic view of an embodiment of a housing with reference to the accompanying FIGURE

BRIEF DESCRIPTION OF THE DRAWING

FIG. 1 shows a schematic diagram of an embodiment of a housing.

DETAILED DESCRIPTION OF THE DRAWING

FIG. 1 shows a housing 10 by way of example, comprising an arrangement space 21, an arrangement space 22 and an arrangement space 23. The arrangement space 21 serves for example for arranging an electric motor (not shown here), the arrangement space 22 serves for arranging a transmission. The arrangement space 23 is formed as a protective space 30. This space serves, for example, for arranging a power electronics system, which is intended to be protected as far as possible from any electromagnetic fields from the arrangement space 21. Provided for this purpose are coating regions 40, which are applied directly to a housing wall 12 of the housing 10.

In particular, the housing wall 12 is coated by means of a spraying method, in particular a thermal spraying method, such as arc wire spraying or else cold gas spraying. The housing wall 12 is produced for example from aluminum, while the coating regions 40 are formed from a ceramic (Al2O3) or a magnesium material. The housing 10 is advantageously cast, in particular cast integrally or as one part, in other words is not put together. It is evident that the coating regions 40 may be arranged both on the inside and the outside of the housing wall 12, whereby not only with regard to the positioning but also with regard to the effectiveness of the shielding there are almost no limits.

LIST OF REFERENCE CHARACTERS

10 Component, housing
12 Housing wall
21 Arrangement space
22 Arrangement space
23 Arrangement space
30 Protective space
40 Coating region

What is claimed is:

1. A method for producing a chassis component of an electric motor vehicle, comprising the steps of:
producing a housing by metal casting, wherein the housing is formed as one part, wherein a wall of the housing defines a first arrangement space, a second arrangement space, and a third arrangement space, wherein the third arrangement space is a protective space;
simulating or calculating a magnetic field and/or an electrical field on the housing; and
positionally accurately arranging and dimensioning a coating applied by a thermal and/or a kinetic spraying method on a portion of the wall of the housing at a region that encompasses the first arrangement space, the second arrangement space, and the protective space based on a result of the simulating or calculating, wherein the coating is a magnetic field shield and/or an electrical field shield.

2. The method according to claim 1, wherein the spraying method is arc wire spraying or cold gas spraying.

3. The method according to claim 1, wherein the coating has a thickness in a range from 50 to 800 μm.

4. The method according to claim 1 further comprising the step of accelerating a coating material that forms the coating to a speed greater than 100 m/s.

5. The method according to claim 1, further comprising the steps of disposing an electric motor in the first arrangement space, disposing a transmission in the second arrangement space, and disposing a power electronics system in the protective space.

* * * * *